United States Patent [19]

Ripingill, Jr.

[11] 4,145,651
[45] Mar. 20, 1979

[54] HAND-HELD LOGIC CIRCUIT PROBE

[76] Inventor: Allen E. Ripingill, Jr., 8825 Revelstoke Way, San Diego, Calif. 92126

[21] Appl. No.: 809,232

[22] Filed: Jun. 23, 1977

[51] Int. Cl.² .................... G01R 31/02; G01R 19/16
[52] U.S. Cl. ............................ 324/72.5; 324/73 R; 324/102; 324/133; 328/58
[58] Field of Search ................... 324/102, 72.5, 73 R, 324/133; 328/58; 340/661, 662, 663, 642

[56] References Cited
U.S. PATENT DOCUMENTS

| 3,532,993 | 10/1970 | Kennedy | 328/58 |
| 3,543,154 | 11/1970 | Gordon | 324/102 |
| 3,628,141 | 12/1971 | Union et al. | 324/72.5 |

Primary Examiner—Rudolph V. Rolinec
Assistant Examiner—Ernest F. Karlsen
Attorney, Agent, or Firm—Spensley, Horn & Lubitz

[57] ABSTRACT

A probe for developing a visual indication of the electrical state of a selected point in a digital circuit under test. The probe is provided with two clips for attaching to the power supply and the ground of the circuit to be tested. The operator then holds a sharp tip of the probe at the selected point at which the electrical condition of the circuit is to be tested. Two light emitting diodes visible on the probe body display which one of the six possible circuit conditions exist at the selected point, such as open circuit, positive-going pulse, negative steady-state and so forth. The circuit utilizes integrated circuit NOR and inverting buffer components. Pulses as short as ten nanoseconds may be detected. The probe may be used with any voltage range of the various logic circuit families.

12 Claims, 4 Drawing Figures

HAND-HELD LOGIC CIRCUIT PROBE

BACKGROUND OF THE INVENTION

This invention relates to digital testers for determining the electrical condition of a selected point in a digital circuit under test.

In recent years, several types of identifiable groups of integrated digital circuits have evolved. Each group, also termed a family, has, generally, different operating characteristics, is fabricated of a different basic material and uses different ranges of voltages.

As is well known, digital circuits transfer and utilize information in binary or "on-off" form. Thus, as a general statement, any one point in an operating digital circuit is, at any one instant, at only one of two possible voltage levels. That is, the single point is at a voltage level denoting either a binary "one" or a binary "zero".

There are, however, six possible combinations of voltage conditions that may be found at a given point in an operating digital circuit. Those conditions are open circuit, steady-state positive or negative voltages, positive or negative pulses and continuous pulse trains.

For purposes such as location of a failed component or design testing, it is often necessary to determine which of the six conditions exist at a preselected point in a digital circuit. The condition so determined may then be compared against the condition which should be present, assuming proper circuit operation. In this way, for example, failed circuit components may be located.

The several logic circuit families are generally referred to by acronyms. Following is a list of the several standard families presently on the market by descriptive name, acronym and the signal voltage range utilized:

| Resistor Transistor Logic | RTL | 0 v. to 3.8 v. |
| Diode Transistor Logic | DTL | 0 v. to 5.0 v. |
| Transistor Transistor Logic | TTL | 0 v. to 5.0 v. |
| Metal Oxide Silicon | MOS | 0 v. to −15 v. |
| Complimentry Symmetry Metal Oxide Silicon | CMOS | 0 v. to 15 v. |
| Microprocessors | | −10 v. to +5 v. |

New logic circuit families will, no doubt, be introduced in the future. At the present, however, it is necessary for circuit testing equipment, such as the logic probe herein described, to be capable of sensing voltage states in digital circuits utilizing as small a voltage range as 3.8 volts (RTL) and as great as 15 volts (MOS, CMOS, Microprocessors).

The prior art contains various methods and devices for testing the voltage levels and waveforms present in digital circuits. One very common method involves the use of oscilloscopes. A substantial disadvantage is presented, however, in that a user must shift his eyes from the circuit point being probed to the oscilloscope screen. Not only is this a relatively laborious method but, particularly with small circuit points, the danger of small probe movement resulting in error is increased.

As a result, self-contained logic circuit probes, of which this invention is a substantial improvement, have been developed. Typically, such probes are provided with from one to four lights to monitor the voltage condition of a given circuit point.

An early testing probe is described in U.S. Pat. No. 2,942,189 to Shea et al. In the Shea et al probe, a lead is clipped to the test circuit ground. A single neon light is caused to indicate the presence of a positive pulse or a negative pulse in a digital circuit.

U.S. Pat. No. 3,628,141 to Union et al discloses such a probe having a barrel portion on which output lights are mounted. In the Union et al design, however, the user must monitor the condition of four lights. Moreover, with very short pulses, the Union et al design would not provide a usable output as the output lights would be on for too short a time to be visible. According to Union et al, it will not yield pulse information concerning digital pulses of a width of less than 25 milliseconds. Pulses of much shorter periods are commonly encountered in modern digital circuits.

In U.S. Pat. No. 3,543,154 to Gordon, which employs a single indicator light, the sensing of a short-duration pulse is accomplished by the use of a bi-polar pulse stretcher. Thus, a pulse of some twenty nanoseconds produces a stretched pulse, using cascaded multivibrators, of some 100 milliseconds to drive the indicator light. With the Gordon circuit, it is not possible to discriminate between positive and negative levels or open circuits and the Gordon circuit will not work with multiple supply voltages.

Various other logic probe devices are found in U.S. Pat. Nos. 3,525,939 to Cartmell, 3,619,775 to Naylor et al, 3,742,351 to Palmer et al, 3,838,399 to Brandt, and 3,750,015 to Sheber et al. Each is more complex, less accurate and more costly than the logic probe of this invention.

SUMMARY OF THE INVENTION

In accordance with this invention, a logic probe is provided which utilizes two light sources to provide the voltage condition of any circuit point in the various families of logic circuits. Two parallel paths react to pulses as short as ten nanoseconds and, in a predetermined order, latch or set a circuit component or components and begin the charging of a resistor-capacitor timing circuit. Until the timing circuit capacitor charges to a predetermined level, the enabled branch is held on which causes the associated light emitting diode to turn on. In addition, the circuit creates threshold voltages using Complimentary Symmetry Metal Oxide Silicon integrated circuits and an input voltage divider. The thresholds insure that the probe does not react to spurious voltage levels. In this way, all six possible voltage conditions are sensed in any of the several logic circuit families.

DESCRIPTION OF THE PREFERRED EMBODIMENT

Figure 1:
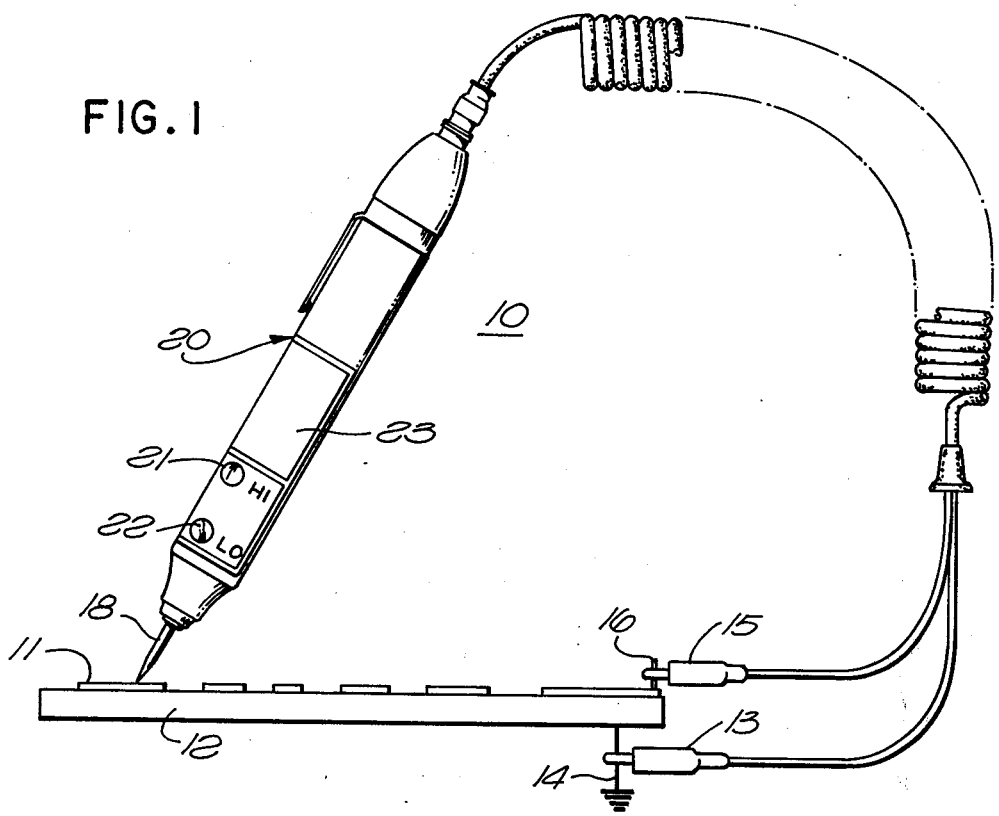
FIG. 1 is a view of the logic probe of this invention with its voltage supply and ground clips connected to a circuit under test.

Referring to FIG. 1, the logic probe of this invention 10 is shown as it would be used to determine the voltage condition of a circuit point 11 in a "typical" logic circuit 12. In order to use the probe, a ground allegator or similar clip 13 is attached to the ground terminal 14 of the circuit under test and a voltage supply clip 15 is similarly attached to the circuit's voltage supply 16. By hand, the probe's user presses the tip 18 of the probe against the selected circuit point 11.

Via the two clips 13, 15, then, the probe is provided with operating power as well as the operating voltage range of the circuit under test. As described above, this latter range may vary from as little as 3.8 volts to as much as 15 volts.

The probe body 20 is in the general shape of a large writing pen. Two light emitting diodes 21, 22 marked, respectively, "HI" and "LO" are visibly positioned in the outer surface of the probe body. By touching the probe tip against any circuit point, the user can determine, by observing the two light emitting diodes 21, 22 whether the circuit point selected is floating (e.g., an open circuit), bears a positive or negative going pulse, a positive or negative steady-state voltage or a repeating wave.

Also attached to the outer surface of the probe body is a "truth table" 23, shown in detail in FIG. 2, which lists the possible combinations of conditions of the light emitting diodes (referred to below as LED's).

Figure 2:
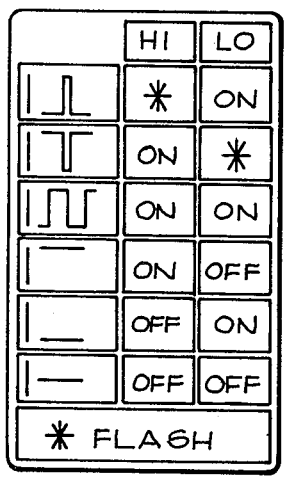
FIG. 2 is a drawing of the "truth table" which is attached to the outer surface of the probe of FIG. 1.

Referring to FIG. 2, it may be seen that, if the LO LED is turned on and the HI LED flashes, the user knows that a positive going pulse was detected. If both LED's are on, the probe detected a repetitive pulse wave, and so forth. It is believed that the data of FIG. 2 is readily understandable from an examination of that figure.

Figure 3:
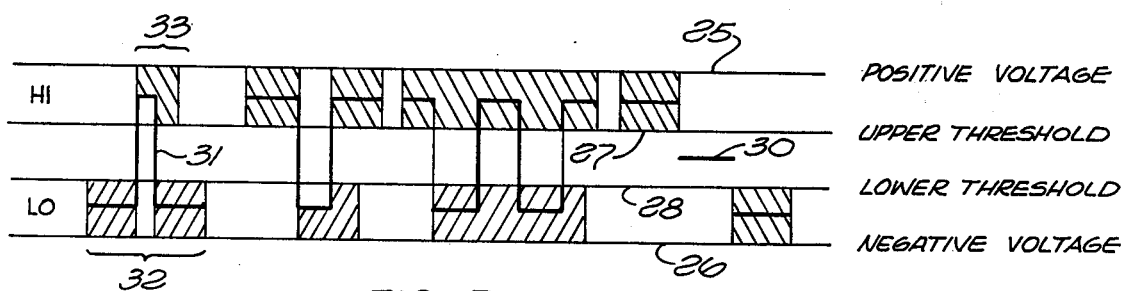
FIG. 3 illustrates the action of the two light emitting diodes as a result of sensing the six possible circuit conditions in a digital circuit.

FIG. 3 illustrates the LED outputs, as well as the thresholds involved in the probe of this invention. The positive voltage and negative voltage levels 25, 26 are determined by the voltage range of the circuit under test and are transferred to the probe via the clips 13, 15 (FIG. 1). The upper and lower thresholds 27, 28 are determined by the voltage range of the circuit under test and input voltage divider resistors and diodes, as explained below in connection with FIG. 4.

If the probe tip (18, FIG. 1) senses a voltage that falls between the two thresholds, as represented in FIG. 3 by the horizontal line 30, neither LED is turned on. Similarly, a positive going pulse 31 causes the LO LED to be turned on as represented by the lined areas 32 and the HI LED to be turned on for 50 milliseconds (to flash) as represented by the lined area 33. Note that the pulse stretcher (described below) causes the HI LED to turn on for 50 milliseconds for any pulse greater than ten nanoseconds in duration. In similar fashion, FIG. 3, by the crossed areas, indicates when the HI and LO LED's would be on, off or flashing, given a sensed voltage waveform as shown.

Figure 4:
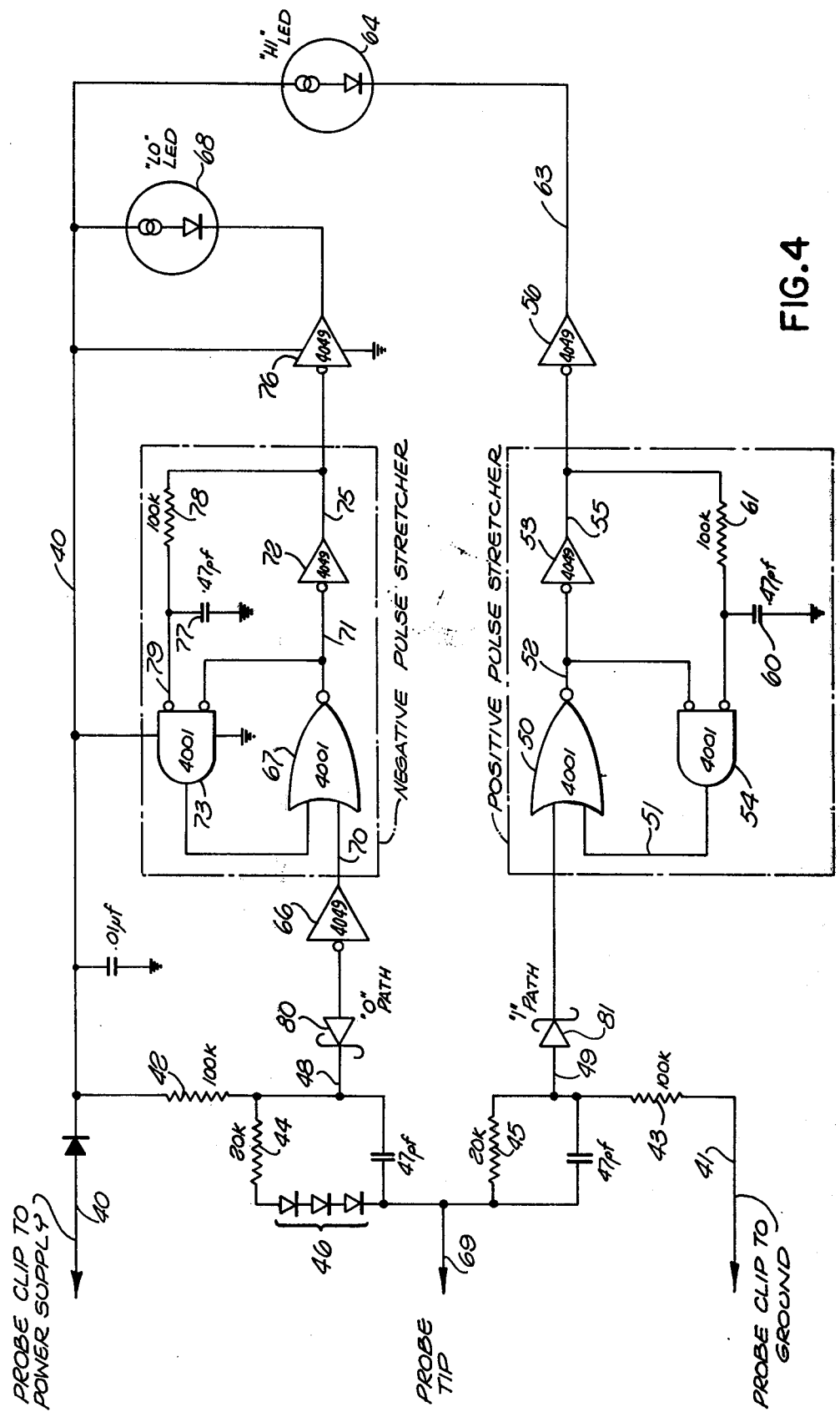
FIG. 4 is a circuit diagram of the logic circuit of this invention, illustrating the interconnection of the integrated circuits and other circuit components.

The preferred embodiment of the probe of this invention is shown in FIG. 4. Before describing the operation of the circuit, the integrated circuits, LED's and diodes used will be identified, as well as certain standards adopted in the drawings.

The buffers shown in the drawing of FIG. 4 are all inverting. In the preferred embodiment, CMOS hex inverting buffers manufactured by Motorola under part number MC14049B are used, although equivalent integrated circuits or logic components could be substituted. The NOR gates in the preferred embodiment are CMOS Quad 2-input NOR gates manufactured by Motorola under part number MC14001B. As with the buffers, equivalent integrated circuits or logic components could be substituted.

All simple diodes shown are IN 4148 diodes, available from any manufacturer. The light emitting diodes (LED's) are manufactured by Litronix, Inc., Cupertino, California, under part number RLC 210.

Though shown separately in FIG. 4, the buffers on the one hand and the NOR gates on the other are actually contained in two integrated circuits. Each circuit is provided with a single pin to which supply voltage is connected and a single pin to which ground is connected. Thus, whereas, for example, FIG. 4 does not depict supply voltage actually supplied to each buffer and NOR gate, each unit is, in fact, connected to the same supply voltage line. This drawing convention, which also applies to a common ground, is generally used when depicting digital integrated circuits.

As is well known, NOR gates are digital logic elements which generate an output level on a single line determined by the condition appearing on each of two input lines. This logic relationship between the input and output of a NOR gate is shown in the following table:

| Input 1 | Input 2 | Output |
|---------|---------|--------|
| 0 | 0 | 1 |
| 0 | 1 | 0 |
| 1 | 0 | 0 |
| 1 | 1 | 0 |

In the table, binary zeros and ones are used to illustrate the logic relationship. As is well known, these numerical values are assigned and could be replaced in the table with "high" and "low" voltage levels.

Finally, FIG. 4 utilizes a logic circuit drawing convention which illustrates the polarity of enabled or enabling voltage levels. Referring, for example, to NOR gate 50, there is shown a small circle at its output line 52. This indicates that, when enabled, the output of the gate is at a low voltage level or binary "0". Similarly, the circles on the input lines to NOR gate 54 indicate that the gate is enabled with two low inputs.

Referring to FIG. 4, line 40 is connected to a power supply terminal of the circuit under test via a clip (15, FIG. 1), as previously described. Similarly, ground line 41 is connected to ground of the circuit to be tested. Thus, across the resistor-diode branch depicted, the maximum voltage of the circuit under test is placed. A maximum of fifteen volts may appear between the supply and ground lines 40, 41 in the preferred embodiment.

For the purpose of illustration of the operation of the circuit of FIG. 4, it is assumed that voltage supply line 40 is connected to a positive ten volts and line 41 is ground in the circuit to be tested. This could be the case, for example, when using the probe with certain CMOS logic circuits.

The first and last resistors 42, 43 are each 100,000 ohms whereas the two center resistors 44, 45 are both 20,000 ohms. In the preferred embodiment, it has been found desirable to shift the lower threshold slightly by the addition of three serial diodes 46.

It is believed that the operation of the circuit of FIG. 4 can best be understood by examining the various voltage levels throughout the circuit under two assumed conditions. First, an analysis of voltage levels will be made assuming that the probe tip is not in the circuit or that it is sensing a floating voltage between the two thresholds (e.g., line 30 in FIG. 3). Secondly, a similar analysis will be made assuming that the probe tip senses first a long low level voltage following a positive-going voltage pulse. By these two analyses, the operation with all six possible conditions in a circuit under test may be readily understood.

Given ten volts on line 40 and the resistor values as stated, assuming the probe tip is not touching the circuit under test, the voltage divider circuit will impress a voltage of about 5.8 volts on the "0" input line 48 and 4.2 volts on the "1" input line 49.

An inherent characteristic of the CMOS integrated circuits employed herein is that each element establishes a threshold equal to half of the voltage between the supply line and ground. Thus, in the ten volt example of FIG. 4, the CMOS threshold would be five volts. Any voltage above five volts is recognized as a binary "1" and any voltage below five is recognized as a binary "0".

Thus, in the above example, assuming the probe tip is not in the circuit, a binary "0" is presented to the "1" path on line 49 and a binary "1" is presented to the "0" path on line 48 and the upper input of NOR gate 50. Since its second input line 51 is also down, the NOR gate 50 is presented with two "0" inputs and develops a "1" voltage on its output line 52, which is simultaneously applied to an inverter 53 and one lead of a NOR gate 54. The inverter 53 develops a "0" on its output line 55 which is applied to the second input of NOR gate 54 via the RC timing circuit 60, 61 and a second inverter 56.

The NOR gate 54 now has inputs of a binary "0" and "1" which maintain its output a binary "0", as shown in the above table. Since line 55 is at a "0" level, no charge is supplied to capacitor 60 via charging resistor 61.

The output of the second inverter 56 is a binary "1" appearing on its output line 63. Thus, since both terminals of the HI LED 64 are high, the LED stays off.

As stated above, a binary "1" appears on lead 48 of the "0" path. Inverter 66 produces a "0" input to NOR gate 67. Thereafter, the same analysis applies to the "0" path logic as stated above. Thus, the LO LED 68 is also held off, indicating (pursuant to the "truth table" of FIG. 2) that the probe tip has no voltage input or that the input is floating between the two thresholds.

In the above analysis of operation, and the one to follow, the NOR gates are discussed in terms which assume that an output is generated immediately upon the application of two inputs. In fact, as is well known in the art, there is some small delay between the time two inputs are applied and the time a change of state in the gate's output is created. In the NOR gates utilized in the preferred embodiment herein, for example, a change of state on the output line occurs approximately 100 nanoseconds after two appropriate inputs are applied. Thus, in the loop including NOR gates 50 and 54, for example, a total inherent delay of about 200 nanoseconds would be encountered if both were caused to change their outputs.

In the second circuit condition to be analyzed by way of illustration of operation of this invention, the various voltage throughout FIG. 4 are examined under the assumption that a positive-going pulse is sensed by the probe tip.

Assuming, then, that the probe tip is touched to a point in the circuit under test which is initially at ground level after which a positive-going pulse is detected, the circuit operates as follows. Initially, it is assumed that the probe tip line 69 is at ground, for a relatively long time span, pulling both "0" input and "1" input lines 48, 49 down further. Line 49, previously at 4.2 volts, is now lower. Since the "0" input previously described on line 49 remains unchanged (in binary terms, that is, the input being less than five volts), the binary conditions of the "1" path remain unchanged and the "HI" LED 64 is held off.

Thus, the voltage states of the "1" path are binary "1" levels on lines 52 and 63, with binary "0" levels at both inputs to NOR gate 50 and the lower input to NOR gate 54.

Previously, however, "0" path input line 48 was at 5.8 volts, recognized by the probe CMOS circuitry as a binary "1". Connection of the probe tip to a point at or about ground potential, however, pulls the voltage of the input line 48 down to a value less than five volts. Line 48, then, is placed at a binary "0" voltage level.

The input inverter 66 immediately develops a binary "1" on its output line 70. NOR gate 67 then has on its two input lines a binary "0" and "1". After the inherent delay discussed above (about 100 nanoseconds), the NOR gate output line 71 is enabled, developing a binary "0". The NOR gate output is inverted twice by inverters 72 and 76, causing LO LED 68 to turn on since its upper lead is connected to the power supply line 40 (a binary "1") and its lower lead to a binary "0" at the output of inverter 76.

Since under the assumption of this example a relatively long time span ground potential is detected by the probe tip, the LO LED will remain on. This is easily realized since a binary "1" on lower NOR gate input line 70 will always enable the gate irregardless of the binary signal appearing on the second input line. So long as NOR gate 67 is enabled, LO LED 68 remains on as shown in FIG. 3 for a constant low voltage and, as in this example, for a relatively long time span ground potential.

NOR gate 73 has two inputs, one from the output line 71 of the first NOR gate 67 and a second 79 from the inverter output line 75 via a resistor-capacitor circuit 77, 78. When the voltage level on line 75 is first set at a binary "1", capacitor 77 begins to charge exponentially. After a predetermined time, as discussed below, line 79 reaches a binary "1" level. NOR gate 73 then has dissimilar inputs and generates a binary "0" on its output line.

The state of the circuit described above, then, is that the LO LED is turned on. By reference to the truth table on the barrel of the probe (FIG. 2), the user knows that a low level constant voltage is being sensed.

If a positive pulse of short duration is then sensed by the probe tip line 69, both input lines 48, 49 are pulled above five volts, that is, both are placed at binary "1" voltage levels. Turning first to the "0" path (negative pulse stretcher), it will be seen that the LO LED is extinguished for a period of time equal to the positive pulse duration. NOR gate 67 is, during the duration of the pulse, presented with two "0" inputs since line 79 is held at the binary "1" level by the charged capacitor. The output of NOR gate 67, then, is a binary "1" which, inverted twice, causes LO LED to switch off.

The turning off of the LO LED during the positive pulse duration is seen in FIG. 3. For very short pulses, however, of the duration typically encountered in digital circuits, the off time of the LO LED would not be visibly recognized and it would appear to remain on, as shown in the truth table (FIG. 2).

Turning next to the "1" path (positive pulse stretcher), the circuit operates as follows. The upper input to NOR circuit 50 is presented with a binary "1" voltage level. This causes, after the inherent delay of some 100 nanoseconds, the output line 52 to be enabled and develop a binary "0". The NOR gate 50 output, twice inverted, causes the HI LED to immediately turn on since a binary "0" level exists on line 63.

NOR gate 54 then operates to maintain the HI LED on for fifty milliseconds. Prior to the positive pulse being sensed, there was no charge on capacitor 60 and the lower input of NOR gate 54, therefore, was a binary "0". As soon as the positive pulse is sensed, the upper input of NOR gate 54 also becomes a binary "0". The two "0" inputs serve to enable NOR gate 54, following the approximate 100 nanoseconds inherent delay, and generate a binary "1" level on line 51.

So long as line 51 stays at a binary "1", the output of NOR gate 50 remains a binary "0" and the HI LED is held on. Since this is the fact regardless of the binary level on the upper input line of NOR gate 50, a sensed positive pulse sets or latches on the HI LED. This remains the condition so long as NOR gate 54 remains enabled even if, of course, the sensed positive pulse on line 49 has disappeared and line 49 returns to a binary "0".

As soon as the sensed positive pulse enabled NOR gate 50, inverter 53 placed a binary "1" level on line 55. This causes capacitor 60 to begin to charge exponentially through resistor 61. Approximately fifty milliseconds after the charging begins, the capacitor (and the lower input of NOR gate 54) reaches the threshold of gate 54 at which the voltage level is recognized as a binary "1". This causes NOR gate 54 to be disabled which, in turn, disables NOR gate 50, extinguishing the HI LED 64. To the user, it appears that the LO LED 68 has remained on and the HI LED has flashed, which indicates, as shown in the truth table, that a positive pulse was sensed.

The period that the HI LED 64 turns on is fixed by the resistor-capacitor timing circuit values. Changing of their values would vary the flash time to the extent desired.

NOR gate 54, then, may be regarded as a resettable indicator. It is reset by the exponential charging of the timing circuit capacitor 60. So long as NOR gate 54 is latched or set following a sensed positive pulse, HI LED 64 is flashed on.

A similar analysis may be made for all six voltage conditions sensed by the probe. It is noted that the above analyses interchanged "voltages over five volts" with "binary 1", and so on. This was done for ease of explanation only and actual voltage values at points throughout the circuit could readily be substituted.

It has been previously stated that the preferred embodiment of this invention will sense pulses having periods as short as ten nanoseconds. In the range of about ten to 210 nanoseconds, the pulse sensing is controlled by the Schottkey barrier diodes 80, 81 in the "0" and "1" input paths, respectively.

When the pulses first reach the pulse stretcher NOR circuits 50, 67, there is a virtual instantaneous charging of inherent capacitance (estimated at about seven picofarads) within each circuit. Assuming a positive ten nanosecond input pulse, in about that period of time the inherent capacitance in NOR gate 50 charges to the peak value of the input pulse. After the pulse disappears, the charged inherent capacitance slowly discharges through the reverse biased Schottkey diode. The discharge will take more than the approximate 200 nanosecond length of time necessary to enable NOR gate 50. Thereafter, NOR gate 54 is set, as above described, and the fifty millisecond stretched pulse generated. Thus, a ten nanosecond pulse creates, about 200 nanoseconds after its disappearance, a fifty millisecond stretched pulse, causing "HI" LED 64 to turn on or flash for that length of time.

I claim:

1. A test probe for determining the electrical state of a selected point in a digital circuit, comprising:

a voltage divider connectable across the supply voltage of said digital circuit, a central tap of said divider being connectable to said selected point, said divider also having first and second taps between said central tap and the respective ends of said divider, first and second like circuit means for detecting the occurrence of an input thereto in excess of a certain signal level, said first circuit means being connected directly to said first tap to receive an input therefrom, said first tap being selected so that said certain signal level will be exceeded only when said divider central tap is connected to a circuit point having a voltage above a first threshold, an inverter connected to said second tap, said second circuit means being connected to said inverter so as to receive an input from said second tap via said inverter, said second tap being selected so that said certain signal level will be exceeded only when said divider central tap is connected to a circuit point having a voltage below a second threshold, and first and second indicator means cooperating with said first and second circuit means for indicating respectively when the input to the associated circuit means exceeds said certain signal level.

2. A test probe according to claim 1 wherein each of said like circuit means comprises a pulse stretching circuit for producing a true output for a minimum time duration in response to an input in excess of said certain signal level, said pulse stretching circuit continuing said true output for the entire duration that said input exceeds said certain signal level in the event that said entire duration exceeds said minimum time duration.

3. A test probe for determining the electrical state of a selected point in a digital circuit, comprising:

a voltage divider connectable across the voltage supply of said digital circuit, a central tap of said divider being connectable to said selected point, said divider also having first and second taps between said central tap and the respective ends of said divider, first detector circuit means for producing a true output in response to an input thereto in excess of a first signal level, said first detector circuit means being connected to receive an input from said first tap, said first tap being selected so that said certain signal level will be exceeded only when said divider central tap is connected to a circuit point having a voltage above a first threshold, second detector circuit means for producing a true output in response to an input thereto which is below a second signal level, said second detector circuit means being connected to receive an input from said second tap, said second tap being selected so that said input will be below said second signal level only when said divider central tap is connected to a circuit point having a voltage below a second threshold, and first and second indicator means cooperating with said first and second detector circuit means for indicating respectively when the associated detector circuit means produces a true output.

4. A test probe according to claim 3 wherein said second detector circuit means comprises:
   a detector circuit identical to said first detector circuit means, and
   an inverter connected in the input path to said identical detector circuit.

5. A test probe according to claim 4 wherein said first detector circuit means and said identical detector circuit each comprises:
   a first NOR gate having a first input terminal connected to receive the input to said circuit,
   an inverter connected to the output of said first NOR gate,
   a voltage delay means,
   a second NOR gate having its output connected to the second input terminal of said first NOR gate, the first of the two inputs of the second NOR gate being connected to the output of said first NOR gate, and the second of the two inputs of the second NOR gate being connected to the output of said inverter via said voltage delay means.

6. The test probe of claim 2, wherein each pulse stretching circuit comprises;
   a first NOR gate having a first input terminal connected to receive the input to said circuit,
   an inverter connected to the output of said first NOR gate,
   a voltage delay means,
   a second NOR gate having its output connected to the second input terminal of said first NOR gate, the first of its two inputs being connected to the output of said first NOR gate, and the second of its two inputs being connected to the output of said inverter via said voltage delay means.

7. The test probe of claim 6, wherein said voltage delay means comprises a resistor-capacitor charging circuit.

8. The test probe of claim 6, wherein each of said inverters and said NOR gates comprises complimentary symmetry metal oxide silicon integrated circuits.

9. The test probe of claim 1 together with a pair of connectors electrically connected to said divider ends and connectable to the supply voltage terminals of said digital circuit, and wherein said voltage divider comprises serially connected resistors.

10. The test probe claim 6, further comprising first and second Schottkey diodes respectively connected between said voltage divider first and second taps and said first and second pulse stretching circuits.

11. The test probe of claim 1 together with a probe tip connected to said voltage divider central tap.

12. The test probe of claim 1, wherein said first and second indicator means comprise light emitting diodes.

* * * * *